United States Patent [19]
Shibusawa

[11] Patent Number: 5,235,426
[45] Date of Patent: Aug. 10, 1993

[54] SOLID STATE IMAGE SENSING DEVICE HAVING NO FIELD ISOLATION LAYER

[75] Inventor: Katsuhiko Shibusawa, Tokyo, Japan

[73] Assignee: Oki Electric Industry Co., Ltd., Tokyo, Japan

[21] Appl. No.: 819,115

[22] Filed: Jan. 10, 1992

Related U.S. Application Data

[63] Continuation of Ser. No. 397,753, Aug. 23, 1989, Pat. No. 5,099,333.

[30] Foreign Application Priority Data

Aug. 24, 1988 [JP] Japan .................. 63-210370

[51] Int. Cl.⁵ .................. H04N 3/14; H04N 5/335
[52] U.S. Cl. .................. 358/213.31; 358/213.26; 358/213.11
[58] Field of Search .............. 358/213.11, 213.26, 358/213.29, 213.31, 212, 213.23; 354/24 LR

[56] References Cited

U.S. PATENT DOCUMENTS

| | | | |
|---|---|---|---|
| 4,697,200 | 9/1987 | Miyatake | 357/24 LR |
| 5,043,819 | 8/1991 | Cheon et al. | 358/213.23 |
| 5,063,449 | 11/1991 | Shibata et al. | 358/213.23 |

FOREIGN PATENT DOCUMENTS

| | | | |
|---|---|---|---|
| 59-107229 | 12/1984 | Japan | 358/213.23 |
| 63-217660 | 3/1987 | Japan | 358/213.23 |
| 63-275164 | 5/1987 | Japan | 358/213.23 |

*Primary Examiner*—Herbert Goldstein
*Assistant Examiner*—Wendy R. Greening
*Attorney, Agent, or Firm*—Edward D. Manzo; John J. King

[57] ABSTRACT

A method of operating a solid state image sensing device having a plurality of electron transfer channels; first and second photodiodes; and first, second, third and fourth electrodes disposed on the electron transfer channels and surrounding the first and second photodiodes. The method includes the step of applying a first potential to the first electrode to transfer electrons from the second photodiode to an electron transfer channel and simultaneously applying a lower potential to the second, third and fourth electrodes to prohibit the electron transfer from the second photodiode to the transfer channel. The method also applies the first potential to the third electrode to transfer electrons from the first photodiode to the electron transfer channel and simultaneously applies the lower potential to the first, second and fourth electrodes to prohibit the electron transfer from the first photodiode to the electron transfer channel. Finally, the method includes the step of sequentially applying a second potential to the first, second, third and fourth electrodes to transfer electrons through the electron transfer channel.

9 Claims, 12 Drawing Sheets

SOLID STATE IMAGE SENSING DEVICE HAVING NO FIELD ISOLATION LAYER

This is a continuation application of U.S. patent application Ser. No. 07/397,753, filed Aug. 23, 1989, now U.S. patent application Ser. No. 5,099,333.

FIELD OF THE INVENTION

This invention relates in general to a solid state image sensing device, and more particularly to a structure for a CCD (Charge Couple Device) area (image) sensor.

BACKGROUND OF THE INVENTION

Solid state image sensing has received much attention as an effective means for inputting an image to a video camera or image processing device. Solid state image sensing devices are categorized as a CCD type, MOS type or another type using electron transfer forms.

The conventional solid state image sensing device has a plurality of vertical charge transfer channels, an array of photodiodes, a horizontal transfer channel, and a group of electrodes. The electrodes include a first polysilicon electrode for a transfer gate and second and third electrodes for the vertical transfer channel. The device has a plurality of cells which are formed by these elements, and has thick silicon oxide layers formed by LOCOS for cell isolation.

Electrons stored in the photodiode are transferred to vertical transfer channel by way of a transfer gate. The electrons transferred to the vertical channel are transferred to the horizontal transfer channel and an image processing means sequentially.

In such conventional solid state image sensing device, it is difficult to reduce the cell size because field oxide layer uses a large area. Furthermore, such a device has low reliability because many steps are necessary to manufacture such a structure.

An early improvement was made by using a solid state image sensing device with two polysilicon layers.

Figure 8A:
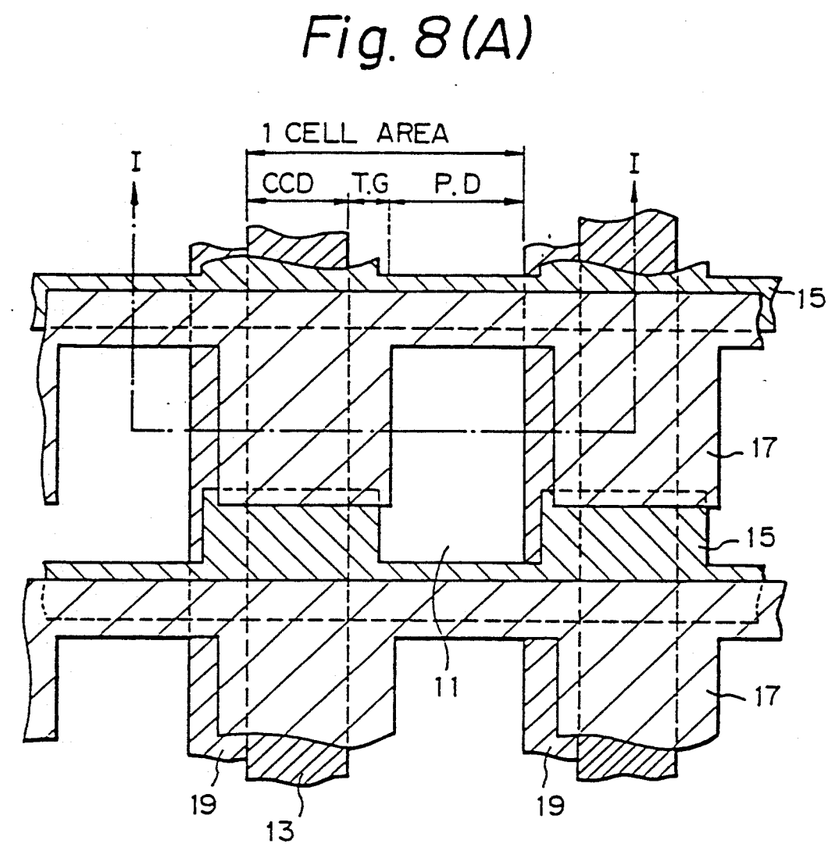
Figure 8B:
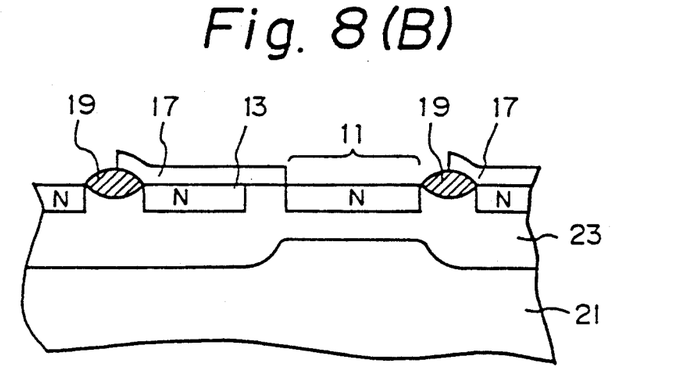

Such a device as shown in FIG. 8(A) and (B) has a plurality of photodiodes 11, a first area 13 of N type semiconductor serving as an electron transfer channel, first and second polysilicon layers 15, 17 acting as transfer gates to a horizontal transfer channel, which is formed on a p well area 23 in a silicon substrate of N type. The layer 17 unites the transfer gate.

In this improved device, the second polysilicon layer 17 is combined with transfer gates in a body which emits electrons from photodiode 11 to the first area 13. Three different voltages are applied to the second polysilicon layer, and two different voltages are applied to the first polysilicon layer. The highest of the three voltages applied to the second polysilicon layer is used for reading out electrons moving from photodiode 11 to the first areas 13. The other voltages are applied to the first and second polysilicon layers and are used for transferring electrons in the first area 13 to the horizontal channel. In this case, since one or both of the two different voltages for transferring electrons to the horizontal channel are present for negative potential, the adjacent cells located in the vertical direction are not separate field oxide layers but polysilicon layers. Therefore, the field oxide areas on the surface of the substrate are reduced in number and total area.

Since the conventional device as shown in FIG. 8 (A) and (B) has the second polysilicon layer which combine with the transfer gates in a body for reading out electrons from the photodiode, it is necessary to form a field oxide layer between the adjacent cells located in the horizontal direction for separating the cells electrically. Therefore, the field oxide layer between the cells is not removed completely.

It is possible to use a third polysilicon layer instead of the field oxide layer for separating the cells electrically. But such a device has a new problem that the number steps are increased and it is difficult to reduce the cell size.

Accordingly, the general object of this invention is to provide a solid state image sensing device capable of separating cells electrically without using a field oxide layer.

Another object of this invention is to provide a solid state image sensing device having cells which are separated electrically from one another by two polysilicon layers.

SUMMARY OF THE INVENTION

In accordance with the present invention, a solid state image sensing device comprises a plurality of vertical CCD arrays and a plurality of transfer electrodes for receiving different clock signals respectively, a plurality of polysilicon patterns for connecting one of the transfer electrodes in one of the vertical channels to one of the transfer electrodes in another vertical channel which receives the same clock signal, and a plurality of photodiode arrays being alternately disposed to the vertical channels, each of the photodiode arrays being encircled by a part of each of the polysilicon patterns in the device. The electrodes are comprised of four different electrodes, designated as the first, second, third, and fourth electrodes. The first through fourth electrodes are located or formed cyclically and sequentially. Each of the cells in the device is separated from its neighbors without field oxide layers.

Furthermore, in accordance with the present invention, the surface of the substrate is formed more evenly than in the conventional device having the field oxide layers, because the cells are separated by only vertical electrodes.

DESCRIPTION OF THE DRAWINGS

In the drawings:

FIG. 1 (A) is a plan view of a solid state imaging device in accordance with the first embodiment of the invention;

FIG. 1 (B) is a sectional view taken substantially along line II—II of FIG. (A);

FIG. 2 (A) is the first polysilicon pattern illustrating interconnection relations between the 1st and 3rd electrodes in accordance with the FIG. 1 embodiment;

FIG. 2 (B) is the second polysilicon pattern illustrating interconnection relations between the 2nd and 4th electrodes in accordance with the first embodiment of the invention;

FIG. 2 (C) is a detailed plan view used to explain the operation of the FIG. 1 device;

FIG. 3 (A)–(D) is a clock diagram for the first field in NTSC signal operation of the FIG. 1 device;

FIG. 4 (A)–(D) is a clock diagram for the second field in NTSC signal operation of the FIG. 1 device;

FIG. 5 (A) and (B) are diagrams showing that the electrons are transferred from the photodiode to the vertical channel in the FIG. 1 device;

FIG. 6 (A) is the second polysilicon pattern illustrating interconnection relations between the 1st and 3rd electrodes in accordance with a second embodiment of the invention;

FIG. 6 (B) is the first polysilicon pattern illustrating interconnection relations between the 2nd and 4th electrodes in accordance with the second embodiment of the invention;

FIG. 6 (C) is a detail plan view helpful in explaining the operation of the device in accordance with the second embodiment of the invention;

FIG. 8 (A) is a plan view of a conventional solid state image sensing device; and FIG. 8 (B) is a sectional view taken substantially along line I—I of FIG. 8 (A).

DESCRIPTION OF PREFERRED EMBODIMENT

A solid state image sensing device of the present invention is explained as follows, referring to the drawings.

The measurements, shapes and arrangements of the preferred embodiment described herein are illustrative and not restrictive, the scope of the invention being indicated by the appended claims and all versions which come within the meaning of the claims are intended to be embraced therein.

We turn now to the drawings, wherein like reference characters designate like or corresponding parts throughout the several views.

The First Embodiment Structure

Figure 1A:
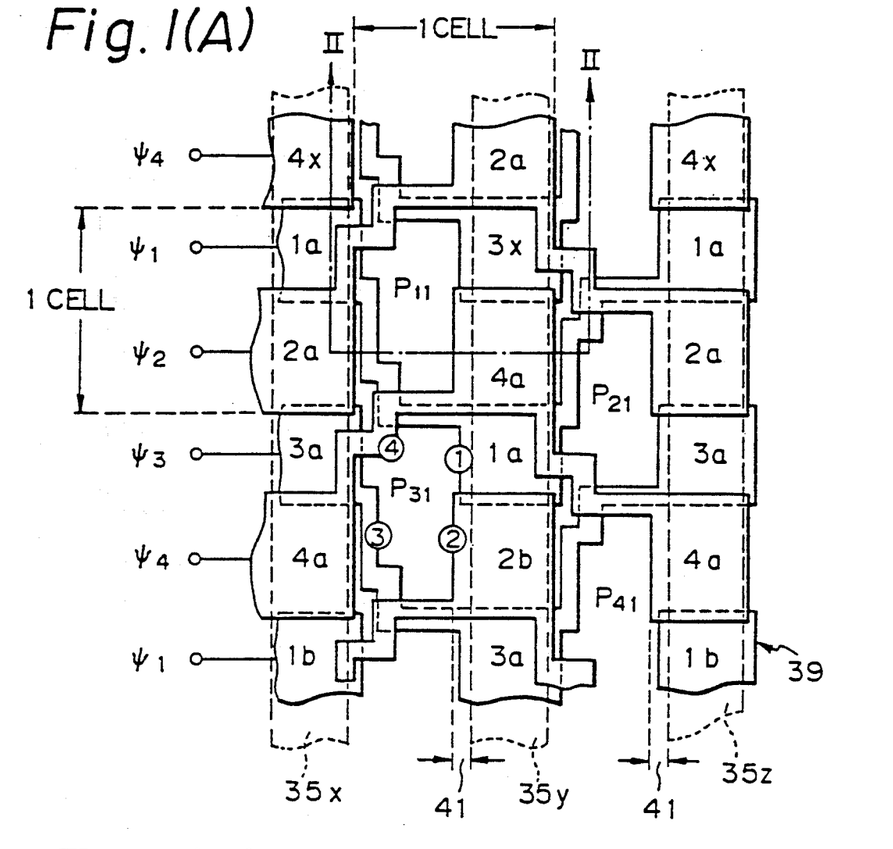
Figure 1B:
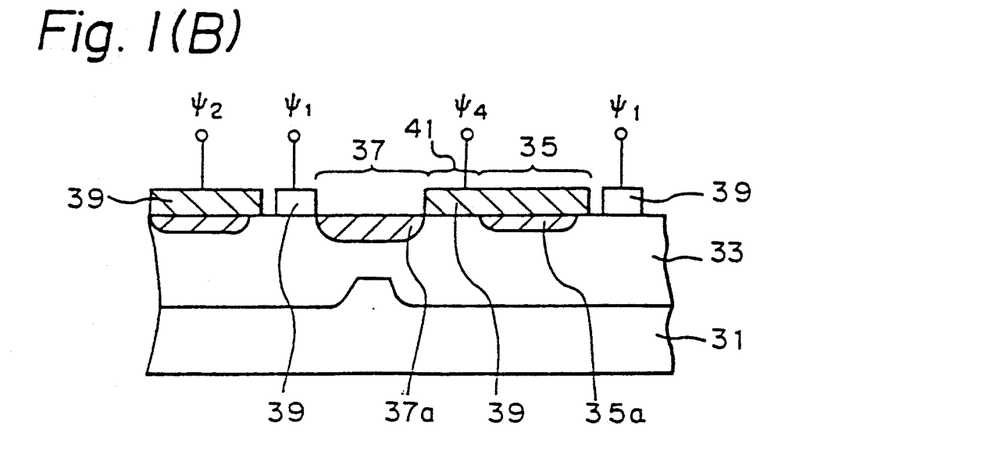

FIG. 1 (A) is a plan view of a solid state image sensing device in accordance with the first embodiment of the invention, and FIG. 1 (B) is a sectional view taken substantially along line II—II of FIG. 1 (A).

In FIG. 1 (B), the device has a P type or N type silicon substrate 31 with a P well area 33, an N type area 35a as transfer road for electrons, and an N type area 37a formed for the photodiodes 37 formed at the surface. It is possible to form a P type area on the N type area 37a in order to increase photodiode capacity. The device further has vertical electrodes coupled to receive different clock signals respectively. A transfer gate 41 is formed in a part of the electrode 39.

In the sectional view of FIG. 1B, three distinct electrodes 39 are shown. However, it will be seen from the plan view of FIG. 1A that four electrodes are used for the four clock signals. A solid state image sensing device will be described with reference to FIG. 1 (A).

The device has three vertical channels 35x, 35y, 35z and a photodiode array with elements P11, P31, P21, P41 arranged alternately as shown in FIG. 1A.

Figure 2A:
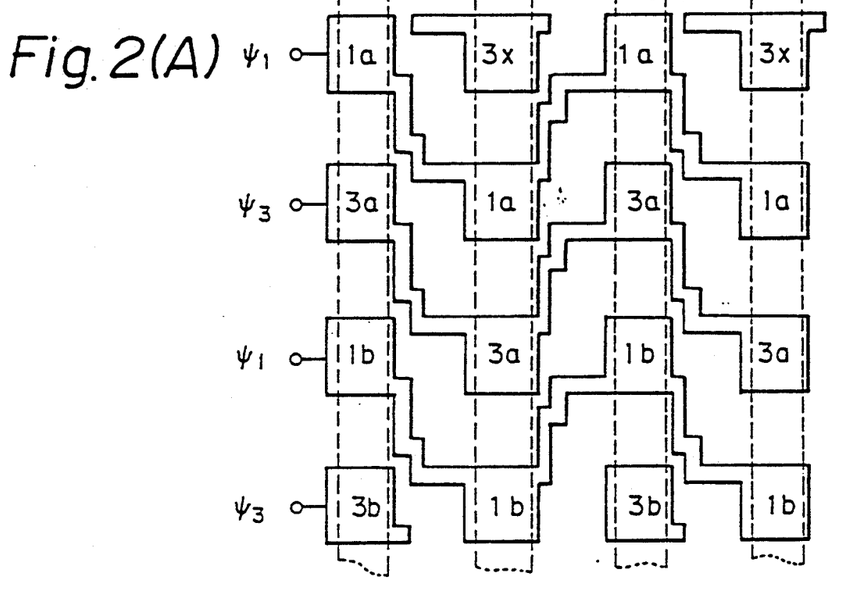
Figure 2B:
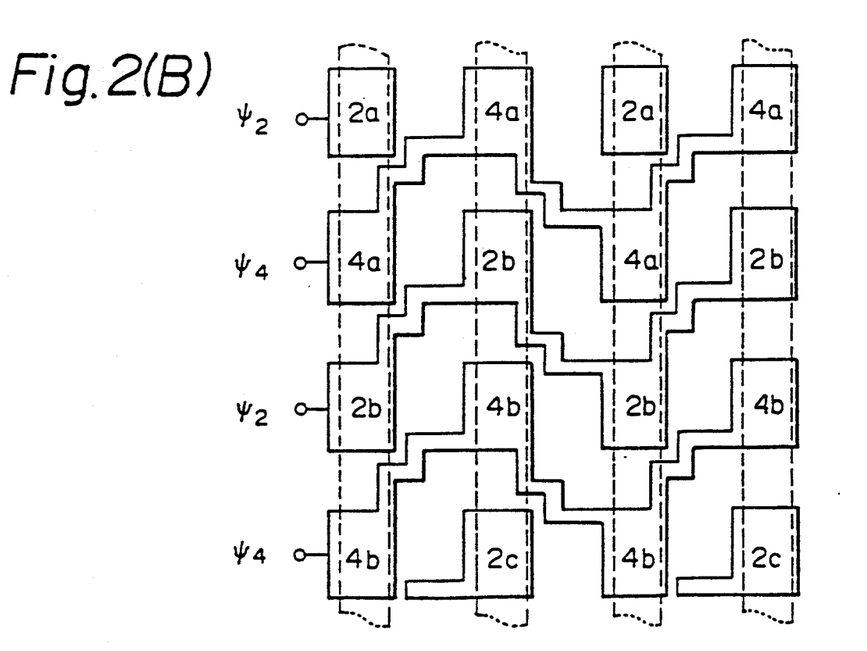
Figure 2C:
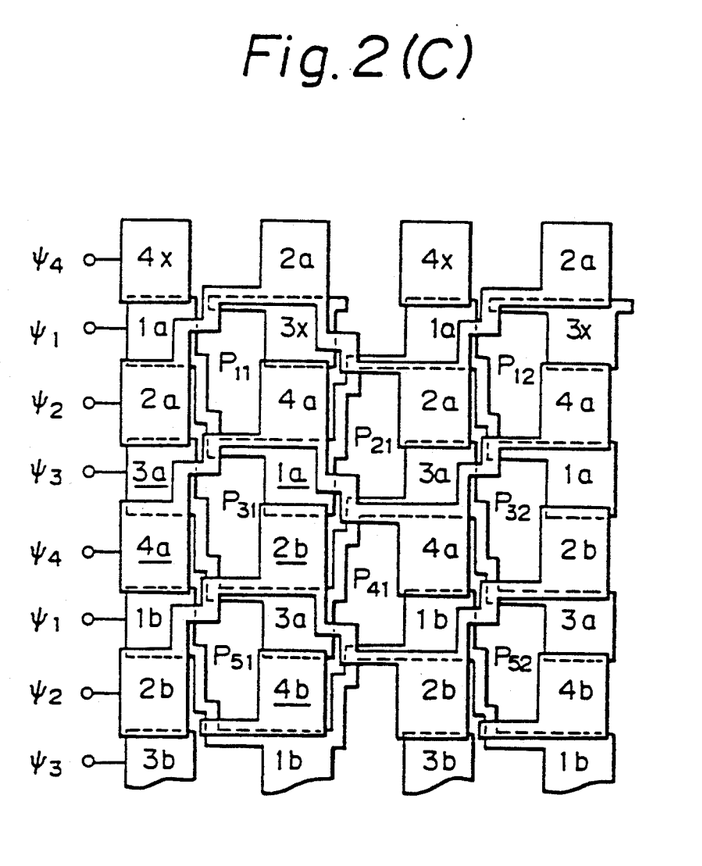

As seen also in FIG. 2A, 2B and 2C, the electrodes for the vertical channels 35x, 35y, 35z comprise first electrodes 1a, 1b to which a clock signal $\psi_1$ is applied, second electrodes 2a, 2b to which a clock signal $\psi_2$ is applied, third electrodes 3a, 3x to which a clock signal $\psi_3$ is applied and fourth electrodes 4a, 4x to which a clock signal $\psi_4$ is applied.

The first, second, third and fourth electrodes 39 which are formed on any single vertical channel 35x, 35y, 35z are arranged cyclically in this order: 1, 2, 3, 4 as seen in FIG. 1A. In the adjacent vertical channel, the electrodes are arranged with a cycle offset by two stages so that as one progresses across FIG. 1A horizontally, first electrodes are next to third electrodes, and second electrodes are next to fourth electrodes.

For example, in the vertical channel 35x, the electrodes are arranged in order of 4x- 1a - 2a - 3a - 4a - 1b. The adjacent vertical channel 35y has electrodes in the order of 2a - 3x - 4a - 1a - 2b - 3a which also conforms to the cycle of 1,2,3,4....

Thus it will be seen that charge transfer channels 35x, 35y and 35z all are formed by an ordered succession or sequence of first, second third and fourth electrodes (when viewed from top to bottom in the figures). Moreover, in the adjacent vertical channels 35x and 35y, first electrode 1a of channel 35x is adjacent to and corresponds with the third electrode 3x of the vertical channel 35y, namely, the electrode in the adjacent vertical channel 35y. It will be understood that referring to adjacent arrays, first electrodes are adjacent to third electrodes, and second electrodes are next to fourth electrodes. In this way, the adjacent cycles are shifted by two with respect to each other in terms of electrode number as one progresses across the device laterally.

The electrodes marked as 1a for example are referred to as electrodes of the same kind. Electrodes of the same kind are disposed in a zigzag pattern. As best seen in FIGS. 2A and 2B, electrodes 1a for example are arranged in a (digitalized) sawtooth or zigzag pattern, as are the other electrodes. The electrodes of the same kind on the different vertical channels are connected along the edge of photodiode by polysilicon patterns which also are shown in FIGS. 2A and 2B. The polysilicon patterns connecting the first electrodes, and polysilicon patterns connecting the third electrodes are geometrically similar to one another and are disposed similarly, and may be said to be "in phase." Looking at FIG. 2A for example and reading left to right, in each case, the polysilicon pattern goes down to the next electrode and then up to another electrode. The polysilicon patterns from the second electrode and the fourth electrode shown in FIG. 2B are geometrically similar to each other, are disposed similarly, and are "in phase" with each other, but they are "out of phase" from the pattern shown in FIG. 2A by 180 degrees. They may be seen in FIG. 2(B) as going up, then down (reading left to right).

Thus it may be said that the respective polysilicon patterns of the first electrode and the second electrode are disposed in reverse directions.

Looking again at FIG. 1(A), the polysilicon pattern from the first electrode 1a in the vertical channel 35x extends to near the third electrode downward (i.e., toward the bottom of the page) along a right side of the second electrode 2a. Then the polysilicon pattern reaches the first electrode 1a in the adjacent channel 35y. In this way, the pattern for electrodes 1a detours or skirts around the photodiode P11.

The polysilicon pattern from the first electrode 1a in the vertical channels 35y next extends upward along the right side of the fourth electrode 4a in the channels 35y, and then the polysilicon pattern is connected to the first electrode 1a in the vertical array 35z. The polysilicon pattern between vertical channel 35y and vertical channel 35z detours around the photodiode P21 similar to the polysilicon pattern between vertical channel 35x and vertical channel 35y.

The polysilicon pattern from the third electrode connects and detours similar to the polysilicon pattern from the first electrode.

The polysilicon pattern from the second electrode 2a in the vertical charge transfer channel 35x extends upward along a right side for the first electrode 1a in the vertical channel 35x, and then generally traverses to the right to join second electrode 2a in the vertical channel 35y.

Then proceeding to the right, the polysilicon pattern extends downward along the right side of the third electrode 3x in vertical channel 35y, and then, the second electrode 2a in the vertical channel 35z. The polysilicon pattern detours around the photodiodes P11 and P21.

The connection and direction of the polysilicon pattern for the fourth electrodes 4a, 4b are similar to the polysilicon pattern from second electrodes 2a, 2b.

FIGS. 2(A) and (B) show the polysilicon pattern interconnections for the electrodes 1a, 3a, 1b, 3b (FIG. 2A) and 2a, 4a, 2b, 4b (FIG. 2B).

The first electrodes and the third electrodes shown in FIG. 2 (A) are formed on the same surface. The second electrodes and the fourth electrodes shown in FIG. 2 (B) are formed on the first and third electrodes.

The vertical transfer channels are indicated by broken lines FIGS. 1A, 2A and 2B.

First, a polysilicon pattern shown in FIG. 2(A) is formed on the P-well layer 33, and then a polysilicon pattern shown in FIG. 2 (B) is formed in a predetermined relationship. As a result, vertical electrodes 39 shown in FIGS. 1A and 1B are formed.

Therefore, it will be appreciated from these figures and the foregoing description that each of the photodiodes is surrounded by parts 1, 2, 3 and 4 of the first, second, third, and fourth electrodes.

It is preferred that the electrodes are formed with polysilicon.

First Embodiment-Operation

A read out method and transfer method of electrons in the device of the first embodiment of the invention are explained as follows Referring to FIG. 2(C)-FIG. 4, the illustrated structure is driven by clock signals of 4 phases.

The second and the fourth electrodes form the second layer and are combined with a transfer gate in a body.

A clock signal $\psi_1$ at the electric potential $V_M$ or $V_L$ is applied to the third electrode. It is preferred that either $V_L$ or $V_M$, or both are set to negative potentials.

A clock signal $\psi_2$ at the electric potential $V_H$ is applied to the second electrode to read out the electrons to the vertical channel from the photodiode and is at the electric potential $V_M$ or $V_L$ to transfer the electrons.

A clock signal $\psi_4$ at the electric potential $V_H$, $V_M$ or $V_L$ is applied to the fourth electrode.

FIGS. 3(A-D) and 4(A-D) are timing charts to explain the operation of the of clock signals which are applied to the electrodes in a field storing mode.

FIG. 3 (A)-(D) are the timing chart diagrams of the first field, and FIG. 4 (A)-(D) are the timing chart diagrams of the second field.

Since the clock signal $\psi_2$ is at $V_H$ level (12V, for example) between time t1 and t2, the other clock signal is at $V_L$ level (-6V, for example) in the signal condition, the electrons in photodiode P31 shown in FIG. 2 (C) are applied to the array of electrodes and transfer channels by electrode 2b only, because the electrodes 1a, 3a and 4a (except 2b) which surround the photodiode P31 are at $V_L$ level. The electrons are not transferred to the direction of these electrodes.

The clock signal $\psi_2$ falls from $V_H$ level to $V_L$ level at time t2, and the clock signal $\psi_4$ goes to $V_H$ level at time t3. As a result, electrons in photodiode P51 shown in FIG. 2 (C) are applied to the array by electrode 4b only. Because the electrodes (except 4b) which surround the photodiode P51 are at $V_H$ or $V_L$ level, the electrons are not transferred in the direction of these electrodes.

Figure 3A:
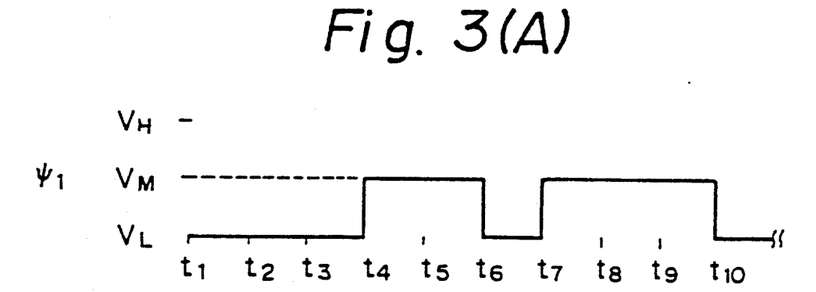
Figure 3B:
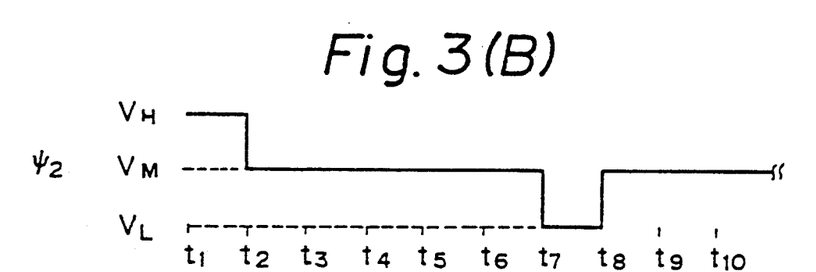
Figure 3C:
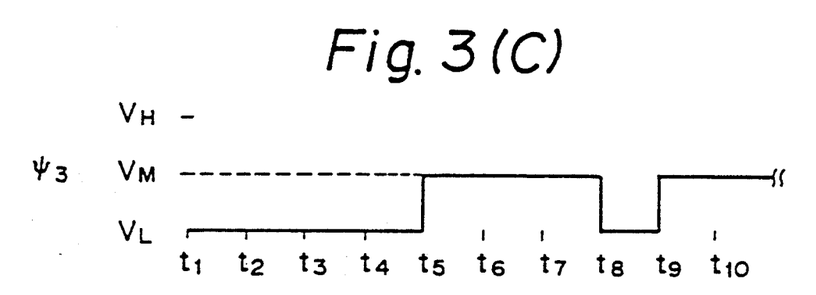
Figure 3D:
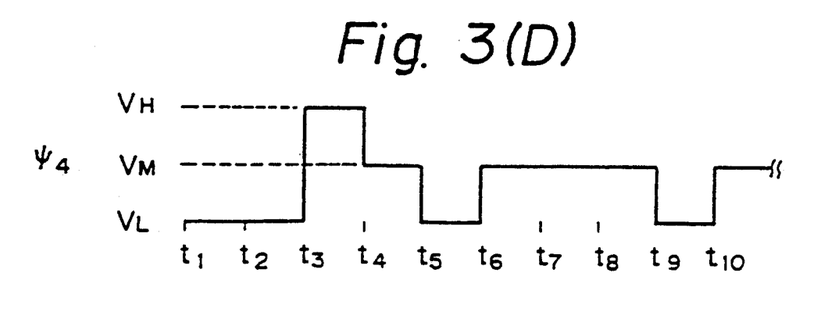

Next, the clock signal $\psi_1$ goes to $V_H$ level between time t4 and time t5 as shown in FIG. 3A.

The electrons from photodiode P31 and the electrons from photodiode P51 are mixed and then transferred sequentially in the first field.

Figure 4A:
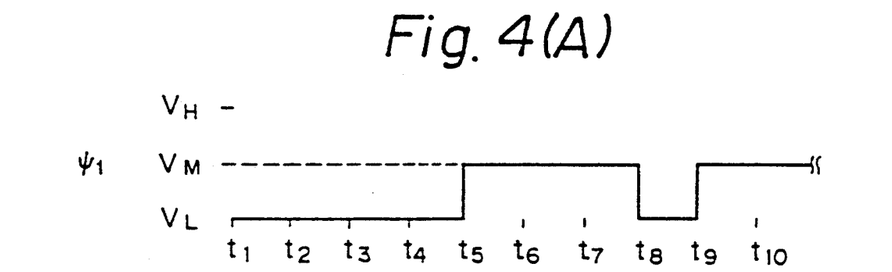
Figure 4B:
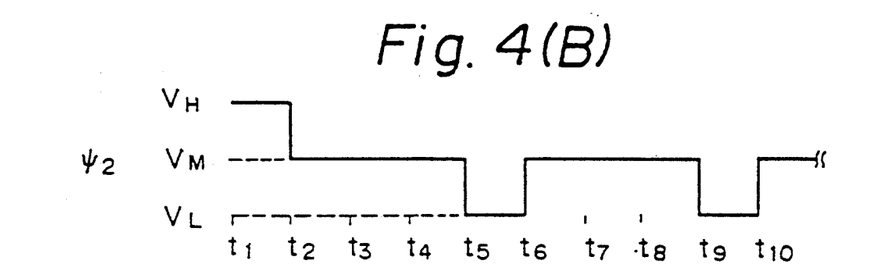
Figure 4C:
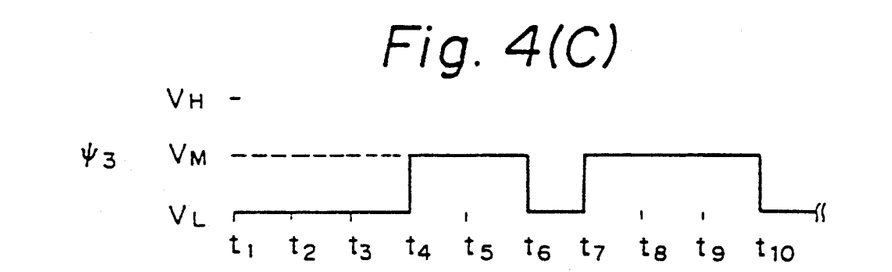
Figure 4D:
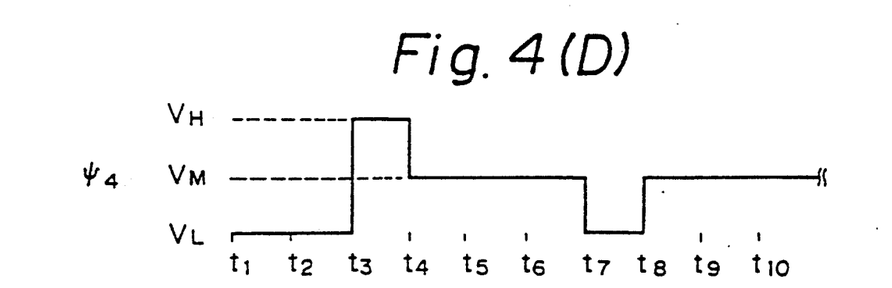

In the second field, the clock signal $\psi_3$ goes to $V_M$ level between time t4 and time t5.

Figure 5A:
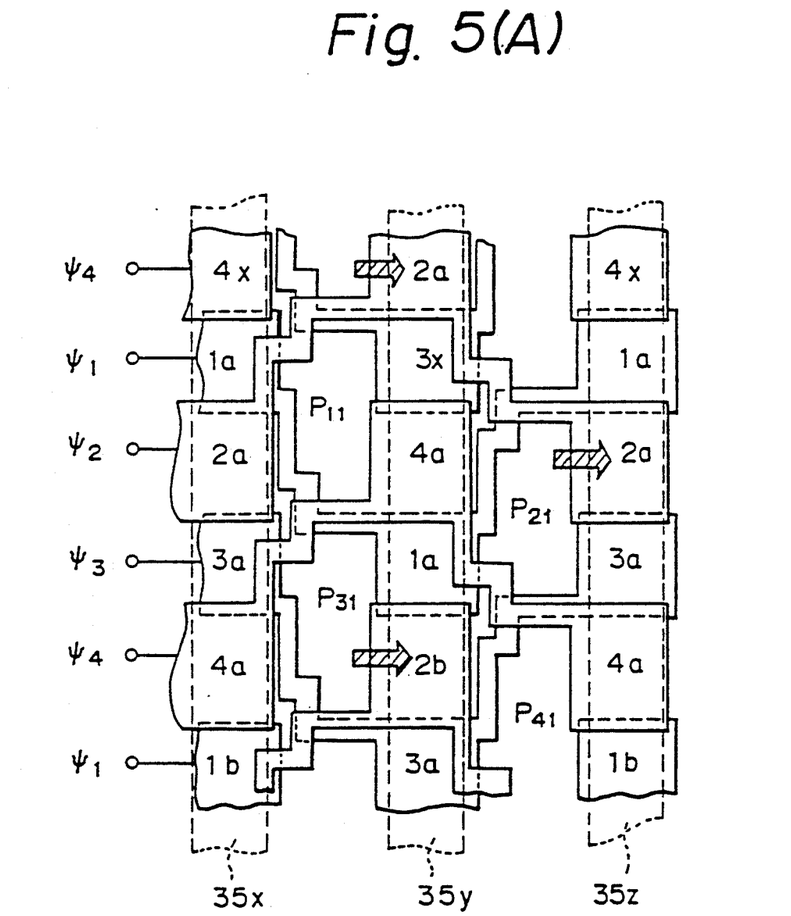
Figure 5B:
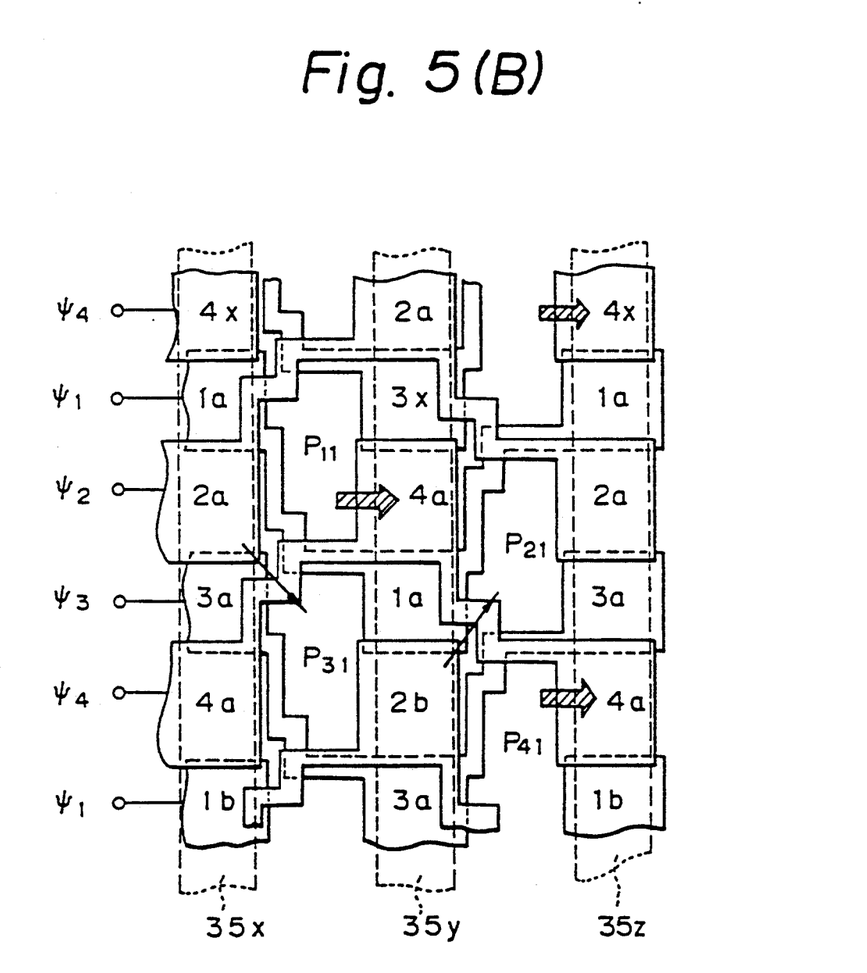

The electrons from photodiode P11 and the electrons from photodiode P31 are mixed and then transferred sequentially. The device of the first embodiment of the invention presents no problem during normal use. However, when the $V_H$ level set at a very high potential value, a pass or pathway for transferring the electrons may be formed at an undesired area. This problem is explained as follows referring to FIG. 5(A) and (B).

Between time t1 and t2, since the clock signal $\psi_2$ is set at the $V_H$ level, the other clock signals are all at the $V_L$ level, the electrons are transferred as indicated by the shaded arrow from photodiode P31 and photodiode P21 to the vertical channel. Between time t3 and time t4, the clock signal $\psi_4$ goes to $V_H$ level. But if the $V_H$ level is set at a very high potential value, an undesired pass as a black thick arrow shown in FIG. 5 (B) may be formed. The undesired pass causes disorder in reproducing a printed image. This problem is solved by the image sensing device of the second embodiment of the invention.

The Second Embodiment of the Invention

The device of the second embodiment is a countermeasure to prevent the formation of an undesired pass. Therefore it is now possible to set the $V_H$ level at a very high potential value. The device of the second embodiment has a broad active margin. This embodiment also improves the polysilicon pattern form for vertical charge transfer channels. The device of second embodiment is not different from the device of first embodiment except for the polysilicon pattern. The difference between the second embodiment and the first embodiment is explained mainly as follows.

Figure 6A:
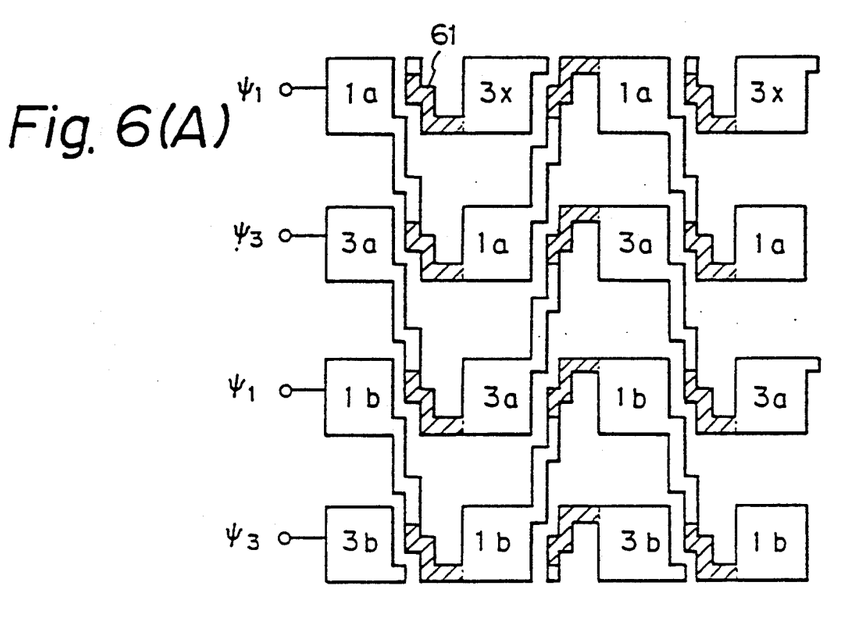
Figure 6B:
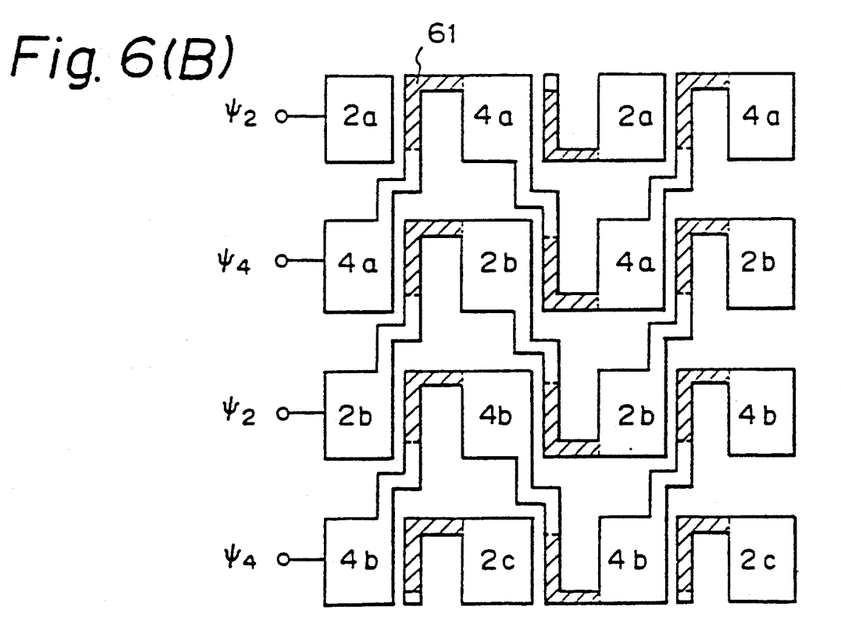

FIG. 6 (A) is the first polysilicon pattern illustrating the interconnection relation between the first and third electrodes in accordance with the second embodiment of the invention. FIG. 6 (B) is the second polysilicon pattern illustrating the interconnection relation between the second and fourth electrodes in accordance with the second embodiment of the invention. FIGS. 6 (A) and (B) correspond to FIGS. 2 (A) and (B) of the first embodiment.

The polysilicon pattern shown in the second embodiment is disposed to take a larger detour around the photodiode compared to that shown in the first embodiment. By comparing FIGS. 2A with FIG. 6A, it will be noted that the polysilicon pattern between the interconnected electrodes is shorter in FIG. 2A than in FIG. 6A. For example, consider the top left electrode 1a in each figure. The polysilicon pattern is connected to the bottom right corner of the top left electrode 1a. In both cases, that polysilicon pattern traverses down and to the right, but in FIG. 2A it connects to the next electrode 1a at its too left corner, whereas in FIG. 6A it connects to the bottom left corner of the adjacent electrode 1a. Likewise, it will be appreciated that in the first embodiment, all polysilicon patterns of FIGS. 2A and 2B take a shorter route in making interconnections than they do in the second embodiment shown in FIGS. 6A and 6B. In the first embodiment, bottom right corners are shown connected to top left corners in the next column to the right. Top right corners are shown connected to bottom left corners in the next column to the right. But in the second embodiment, bottom corners are connected to bottom corners in the adjacent column. The added distance in the second embodiment is the shaded area 61 (FIGS. 6A, 6B).

Figure 6C:
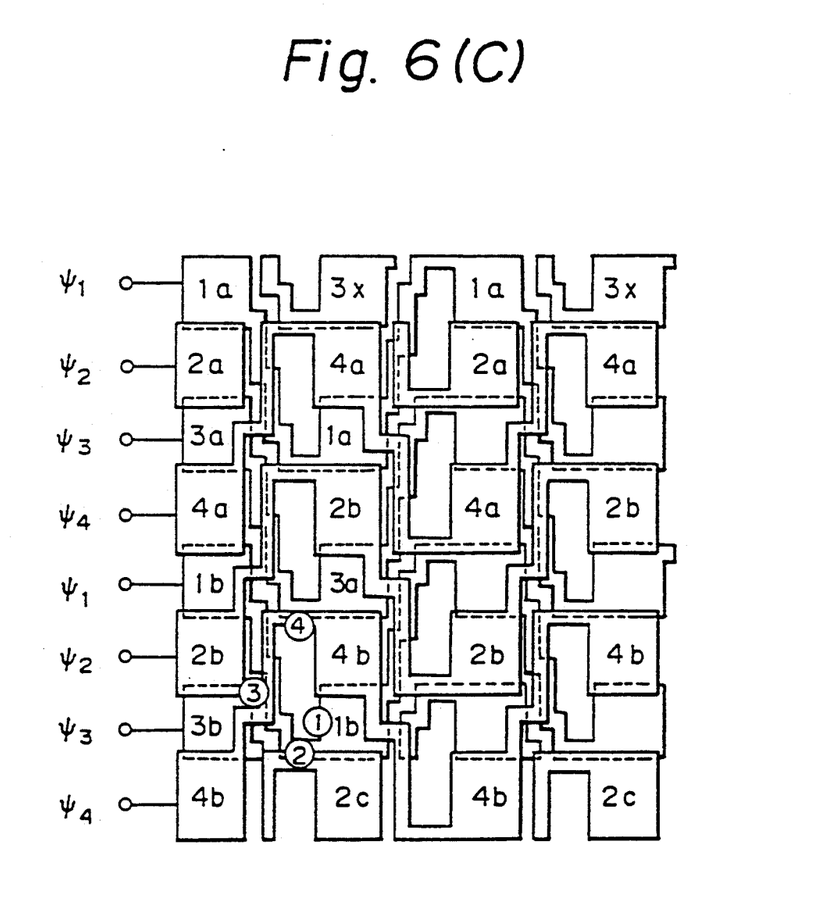

First, a polysilicon pattern shown in FIG. 6 (A) is formed on the P-well 33, and then a polysilicon pattern shown in FIG. 6 (B) is formed to be a predetermined relations. Vertical transfer channels shown in FIG. 6 (C) are formed by this step.

In this embodiment, as in the first embodiment, each photodiode is surrounded by parts 1, 2, 3 and 4 of the first, second, third and fourth electrodes. Since the operating method and operating principle of the second embodiment is the same as the first embodiment, this explanation is omitted.

Figure 7A:
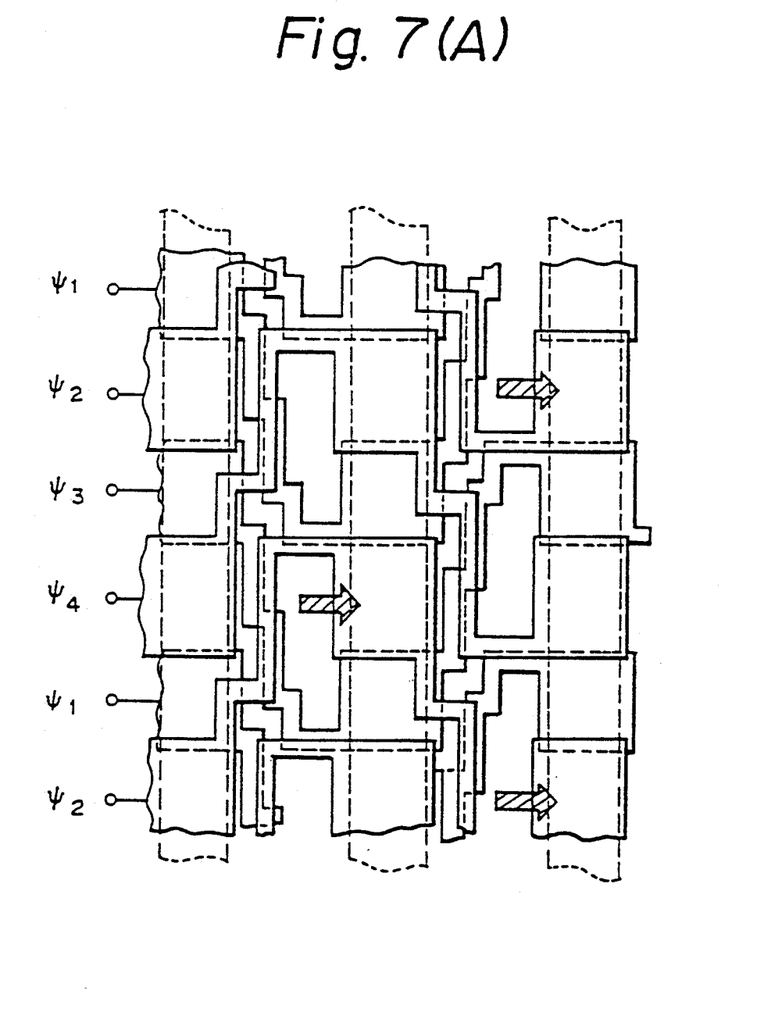
FIG. 7(A) and (B) are diagrams showing transfer of the electrons corresponding to the voltage of the clock signals in accordance with the second embodiment of the invention.
Figure 7B:
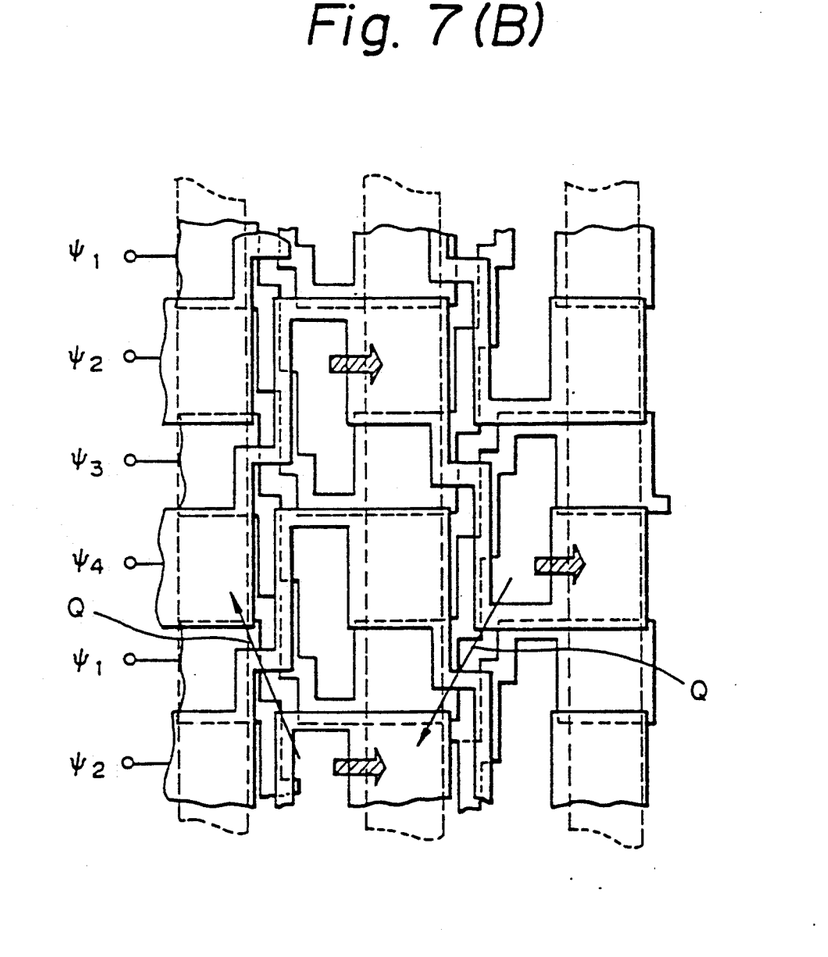

When the clock signal $\psi_2$ goes to $V_H$ level, the electrodes in the photodiode are transferred as shown by the shaded arrow to the determined vertical transfer channel. If the clock signal $\psi_4$ goes to $V_H$ level, the pass arrow Q (FIG. 7B) may be formed. However, this does not occur in the second embodiment, because the pass is the same length as one stage of the transfer channel, and is twice as long as the pass of the first embodiment, and the second electrode which receives the clock signal $\psi_2$ is disposed across the pass arrow Q.

Therefore, in accordance with the second embodiment, it is possible for the $V_H$ level to be set at a high potential value because the electrons are not erroneously transferred to an area except to a predetermined area of a vertical channel under an electrode.

In accordance with the invention, the image sensing device has a wide active area because a field oxide layer or polysilicon for isolation is not formed. It is easy to produce a fine polysilicon layer because a polysilicon pattern is formed more exactly in comparison with a field oxide layer. It is easy to produce the device with an even surface because the device has no field oxide layer. Therefore, since the device has no aggravating factor, reliability is improved.

In accordance with the second embodiment of the invention since it is possible that the $V_H$ level is at higher potential level the device will operate with higher speed.

I claim:

1. A method of operating a solid state image sensing device having a plurality of electron transfer channels; a plurality of photodiode columns each of which is located between the electron transfer channels and each of which includes first and second photodiodes disposed sequentially; first, second, third and fourth electrodes sequentially disposed on the electron transfer channels and surrounding the first and second photodiodes, each of the photodiodes having a first side facing a channel associated with the first and second photodiodes and a second side, the third and fourth electrodes located along the first side of the first photodiode and the second side of the second photodiode, the third electrode located on only a small part of the second side of the second photodiode, the first and second electrodes located along the second side of the first photodiode and the first side of the second photodiode, the first electrode located on only a small part of the second side of the first photodiode, the method comprising:

applying a first potential to the first electrode to transfer electrons from the second photodiode to the region of the channel located under the first electrode and simultaneously applying a potential which is lower than the first potential to the second, third and fourth electrodes to prohibit the electron transfer from the second photodiode to the regions of the channel located under the second, third and fourth electrodes;

applying the first potential to the third electrode to transfer electrons from the first photodiode to the region of the channel located under the third electrode and simultaneously applying the potential which is lower than the first potential to the first, second and fourth electrode to prohibit the electron transfer from the first photodiode to the regions of the channel located under the first, second and fourth electrodes; and sequentially applying a second potential to the first, second, third and fourth electrodes to transfer electrons from the region of the channel located under the first electrode to the region of the channel located under the fourth electrode, the second potential being lower than the first potential.

2. A method of operating a solid state image sensing device according to claim 1 wherein the first potential is a positive potential.

3. A method of operating a solid state image sensing device according to claim 1 wherein the second potential is a negative potential.

4. A method of operating a solid state image sensing device having a plurality of electron transfer channels; a plurality of photodiode columns each of which is located between the electron transfer channels and each of which includes first and second photodiodes sequentially disposed; first, second, third and fourth electrodes sequentially disposed on the electron transfer channels and surrounding the first and second photodiodes, the first electrode having an electron transferring portion disposed on the electron transfer channel and on a first region located between the electron transfer channel and the second photodiode, the third electrode having an electron transferring portion disposed on the electron transfer channel and on a second region located between the electron transfer channel and the fist photodiode, the method comprising:

applying a first potential to the first electrode to transfer electrons from the second photodiode to the electron transfer channel through the first region and simultaneously applying a potential which is lower than the first potential to the second, third and fourth electrodes to prohibit the electron transfer from the second photodiode to the regions of the electron transfer channel located under the second, third and fourth electrodes;

applying the first potential to the third electrode to transfer electrons from the first photodiode to the electron transfer channel through the second region and simultaneously applying the potential which is lower than the first potential to the first, second and fourth electrode to prohibit the electron transfer from the first photodiode to the regions of the channel located under the first, second and fourth electrodes; and sequentially applying a second potential to the first, second, third and fourth electrodes to transfer electrons from the region of the electron transfer channel located under the first electrode to the region of the electron transfer channel located under the fourth electrode, the second potential being lower than the first potential.

5. A method of operating a solid state image sensing device according to claim 4, wherein the first potential is a positive potential.

6. A method of operating a solid state image sensing device according to claim 4, wherein the second potential is a negative potential.

7. A method of operation a solid state image sensing device having a plurality of electron transfer channels; a plurality of photodiode columns, each of which are disposed between electron transfer channels and each of which include first and second photodiodes disposed sequentially; first, second, third and fourth electrode patterns disposed on the electron transfer channels and surrounding the first and second photodiodes, each said photodiode being isolated from others of said photodiodes without insulating material surrounding each said photodiode individually, the method comprising:

applying a first potential to the first electrode to transfer electrons from the second photodiode to the region of the channel located under the first electrode and simultaneously applying a potential which is lower than the first potential to the second, third and fourth electrodes to prohibit the electron transfer from the second photodiode to the regions of the channel located under the second, third and fourth electrodes;

applying the first potential to the third electrode to transfer electrons from the first photodiode to the region of the channel located under the third electrode and simultaneously applying the potential which is lower than the first potential to the first, second and fourth electrode to prohibit the electron transfer from the first photodiode to the regions of the channel located under the first second and fourth electrodes; and sequentially applying a second potential to the first, second, third and fourth electrodes to transfer electrons from the region of the channel located under the first electrode to the region of the channel located under the fourth electrode, the second potential being lower than the first potential.

8. A method of operating a solid state image sensing device according to claim 7, wherein the first potential is a positive potential.

9. A method of operating a solid state image sensing device according to claim 7, wherein the second potential is a negative potential.

* * * * *